United States Patent
Ramsbey et al.

(10) Patent No.: US 6,867,097 B1
(45) Date of Patent: Mar. 15, 2005

(54) METHOD OF MAKING A MEMORY CELL WITH POLISHED INSULATOR LAYER

(75) Inventors: Mark T. Ramsbey, Sunnyvale, CA (US); Robert B. Ogle, San Jose, CA (US); Tommy C. Hsiao, Mountain View, CA (US); Angela T. Hui, Fremont, CA (US); Tuan Duc Pham, Santa Clara, CA (US); Marina V. Plat, San Jose, CA (US); Lewis Shen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/430,366

(22) Filed: Oct. 28, 1999

(51) Int. Cl.[7] .......................................... H01L 21/336
(52) U.S. Cl. ...................................... 438/257; 438/266
(58) Field of Search ................................. 438/257–267

(56) References Cited

U.S. PATENT DOCUMENTS

| | | | |
|---|---|---|---|
| 4,613,956 A | | 9/1986 | Paterson et al. ............ 364/185 |
| 4,713,142 A | * | 12/1987 | Mitchell et al. ............ 438/257 |
| 5,478,767 A | * | 12/1995 | Hong .......................... 438/267 |
| 5,672,892 A | * | 9/1997 | Ogura et al. ................. 257/314 |
| 5,808,339 A | * | 9/1998 | Yamagishi et al. ......... 257/316 |
| 5,962,889 A | * | 10/1999 | Yamauchi et al. .......... 257/317 |
| 6,033,956 A | * | 3/2000 | Wu ............................. 438/261 |
| 6,051,467 A | * | 4/2000 | Chan et al. ................. 438/264 |

OTHER PUBLICATIONS

C.Y. Chang and S.M. Sze, "ULSI Technology", 1996, p. 211.*

* cited by examiner

Primary Examiner—Jack Chen
(74) Attorney, Agent, or Firm—Farjami & Farjami LLP

(57) ABSTRACT

An improved method of making a flash memory cell including a substrate having a floating gate of a first thickness includes depositing an insulator on the substrate and over the floating gate. The insulator is preferably a high quality oxide. A portion of the insulator not covering the floating gate has a second thickness which is greater than the first thickness of the floating gate. The method further includes polishing the insulator until the second thickness is substantially equal to the first thickness. Polishing results in a planar floating gate and insulator layer. The method further includes sequentially depositing a dielectric layer and a control gate layer on the planar floating gate and insulator layer and then etching these layers to complete the stacked gate structure of the memory cell.

10 Claims, 2 Drawing Sheets

METHOD OF MAKING A MEMORY CELL WITH POLISHED INSULATOR LAYER

FIELD OF THE INVENTION

The present invention relates to a method of making a flash memory cell. More particularly, the present invention relates to a process for improving the planarity of a dielectric layer and a control gate layer deposited on the floating gate of the memory cell in order to facilitate patterning of these layers.

BACKGROUND OF THE INVENTION

Flash memory electrically erasable programmable read only memory (EEPROM) devices are electrically erasable non-volatile memory devices fabricated with tunnel oxides and high voltage transistors for programming and erasing the devices.

Flash EEPROM cells are typically formed by growing a thin oxide on a substrate, then depositing a first layer of doped polysilicon or amorphous silicon and etching the first layer to form the floating gate of the memory cell. Next, a dielectric material, such as an oxide-nitride-oxide (ONO) layer is deposited over the entire substrate, and a second layer of doped polysilicon or amorphous silicon is deposited on the dielectric layer. The second layer of doped polysilicon or amorphous silicon forms the control gate of the memory cell. The dielectric layer and the second layer are then etched to form the stacked gate structure of the memory cell.

One problem with the above-described process is that the floating gate makes the topography of the substrate uneven. Thus, when the dielectric layer and the second polysilicon or amorphous silicon layer are deposited, portions of these layers are thicker in some areas and thinner in others. The uneven thickness of these layers makes the process of lithographic patterning and etching of the second polysilicon or amorphous silicon layer and the dielectric layer difficult. As a result, incomplete etching can result along the thicker portions of these layers and overetching along the thinner portions.

There is a need, therefore, for an improved method of fabricating a flash memory cell. In particular, the process should facilitate the etch process of the control gate and dielectric layers.

SUMMARY

The present invention addresses this problem by providing a process which improves the planarity of the substrate following the deposition and etch of the floating gate. This results in a level surface on which the dielectric layer and the control gate layer are deposited.

In accordance with one embodiment of the present invention, a method of making a flash memory cell including a substrate having a floating gate of a first thickness includes depositing an insulator on the substrate. The insulator covers the floating gate, and a portion of the insulator not covering the floating gate has a second thickness which is greater than the first thickness of the floating gate. The insulator is preferably a high quality oxide. High quality oxides include high temperature oxides, such as a LPCVD furnace grown oxide. The method further includes polishing the insulator until the second thickness is substantially equal to the first thickness. The result is a planar floating gate and insulator layer. Next, a dielectric layer and a control gate layer are deposited sequentially on the floating gate and insulator layer. These two layers are then etched to form the stacked gate structure of the memory cell. Because the floating gate and insulator layer is planar, there is little variation in thickness along the deposited dielectric and control gate layers, thereby facilitating removal of these layers during the etch process.

In accordance with another embodiment of the invention, a flash memory cell includes a substrate having a tunnel oxide and a floating gate disposed on the tunnel oxide. The floating gate has a plurality of vertical surfaces, each having a height of a first thickness. The memory cell further includes an insulator disposed on the tunnel oxide and abutting the plurality of vertical surfaces of the floating gate. The insulator is formed by first depositing a layer of the insulator on the substrate, covering the floating gate and having a second thickness greater than the first thickness, and then polishing the insulator until the second thickness is approximately equal to the first thickness. The memory cell further includes a dielectric layer and a control gate disposed on the floating gate to complete the stacked gate structure of the memory cell.

BRIEF DESCRIPTION OF THE DRAWINGS

The present invention can be further understood by reference to the following description and attached drawings which illustrate the preferred embodiment.

DETAILED DESCRIPTION

Figure 1:
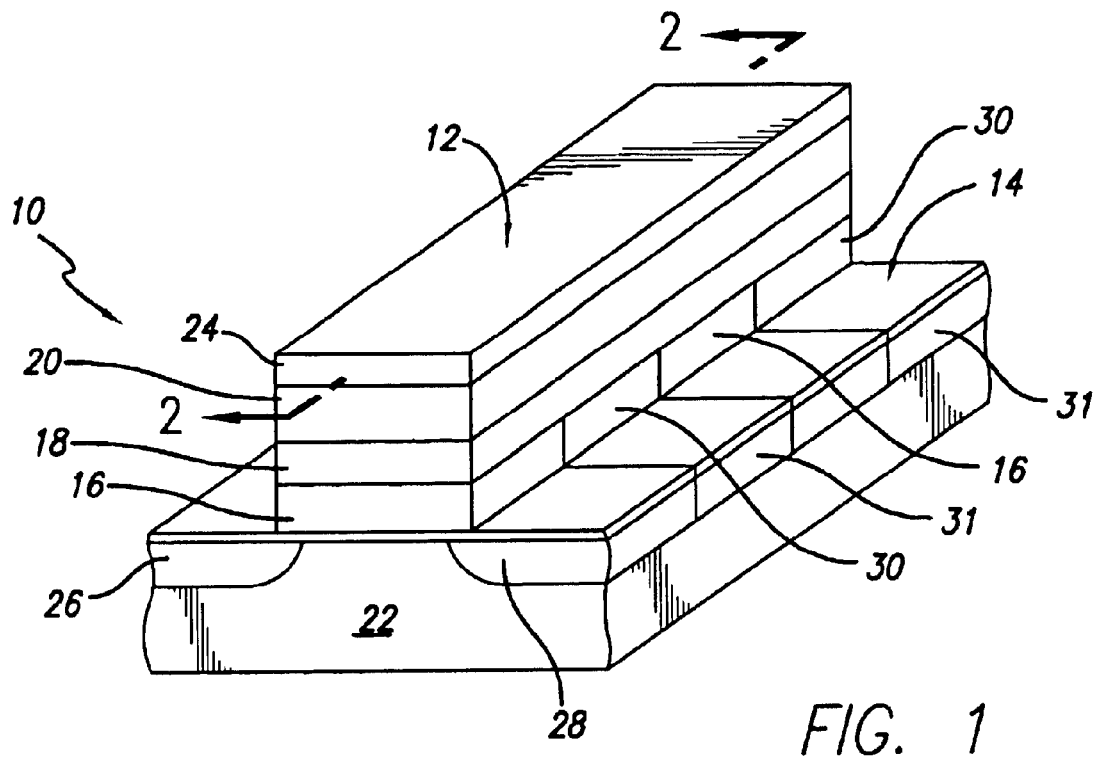
FIG. 1 is a perspective view of a flash memory cell in accordance with the present invention.
Figure 2:
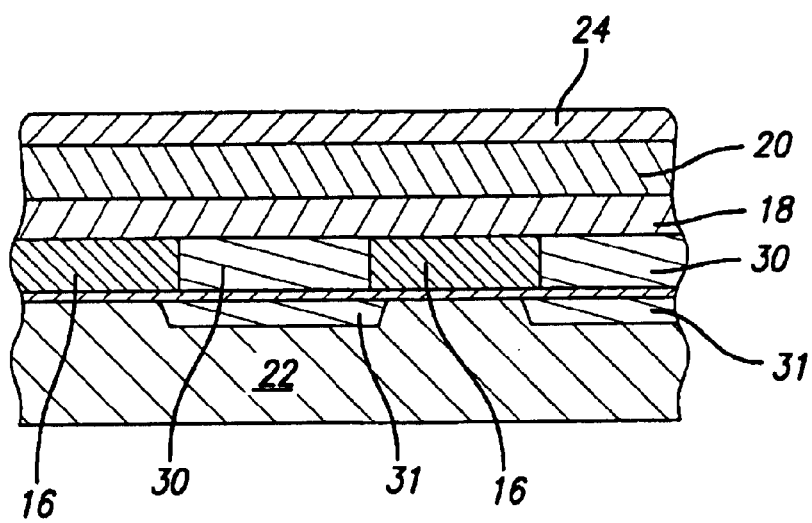
FIG. 2 is a cross-sectional view taken generally along the line 2—2 of FIG. 1.

FIGS. 1 and 2 illustrate a flash memory cell 10 in accordance with the present invention. Memory cell 10 has a stacked gate structure 12, including a tunnel oxide layer 14, a floating gate 16, a dieletric layer 18, and a control gate 20 formed on a silicon substrate 22. Floating gate 16 and control gate 20 are both layers of doped polysilicon. Alternatively, the floating and control gates can comprise doped amorphous silicon or a suitable metal, such as tungsten, over a barrier metal, such as tungsten nitride. Dielectric layer 18 is preferably an oxide-nitride-oxide (ONO) layer. An optional layer 24 can be disposed on top of control gate 20 to lower the resistance of control gate 20. Layer 24 can be a thin salicide or a thicker silicide.

Memory cell 10 further includes an insulator 30 on both sides of floating gate 16. Insulator 30 is preferably a high quality oxide. For example, insulator 30 can be a high temperature oxide, such as a LPCVD furnace grown oxide. Alternatively, other insulator materials can include silicon oxides, silicon oxynitrides, or even a spin-on-glass (SOG). As will be explained in further detail below, insulator 30 has a thickness that is substantially equal to that of floating gate 16, thereby providing a planar floating gate and insulator layer.

Figure 3:
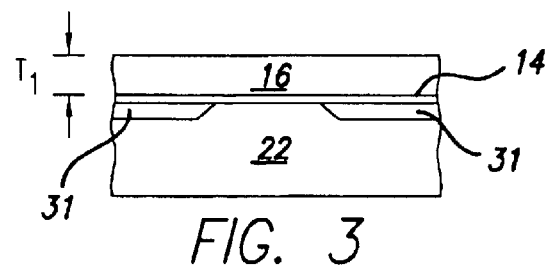
FIGS. 3–7 are sectional views illustrating the sequence of steps in the process of fabricating the flash memory cell of FIG. 1.

FIGS. 3–6 illustrate the process for fabricating memory cell 10. In FIG. 3, shallow trenches 31 are formed in substrate 22 and filled with an oxide. Tunnel oxide layer 14 and floating gate layer 16 are then formed on substrate 22. Tunnel oxide layer 14 is grown on substrate 22 and has a thickness of approximately 50 Å to 150 Å. Floating gate layer 16 is then deposited on tunnel oxide layer 14. As discussed above, the floating gate layer can comprise a doped amorphous silicon or polysilicon or a refractory metal such as tungsten with a barrier layer of tungsten nitride. When floating gate layer 16 includes doped polysilicon or amorphous silicon, floating gate 16 has a thickness $T_1$ of approximately 500 Å to 2000 Å. For a floating gate made of tungsten and a barrier metal of tungsten nitride, thickness $T_1$ can range from 20 Å to 2000 Å.

Figure 4:
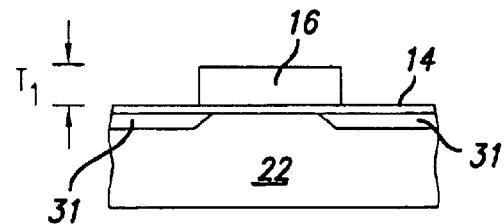

FIG. 4 illustrates the device after floating gate layer 16 has been etched. A photomask (not shown) is placed on top of the floating gate layer, and the layer is etched to form floating gate 16.

At this point the device can undergo an optional thermal oxidation. The oxidation process results in the formation of a layer of oxide (not shown) along the vertical side surfaces 17 of floating gate 16. The oxide seals side surfaces 17 of floating gate 16 to prevent any charge from escaping.

Figure 5:
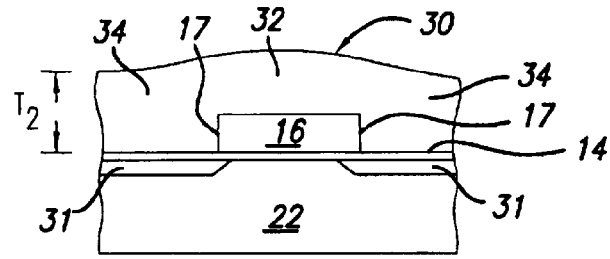

In FIG. 5 an insulator 30 is deposited on substrate 22. Insulator 30 covers floating gate 16. Insulator 30 has a first region 32 and a second region 34. First region 32 of insulator 30 is located over floating gate 16, while second region 34 is not above floating gate 16. Second region 34 has a thickness $T_2$ that is greater than thickness $T_1$ of floating gate 16. Preferably, thickness $T_2$ is between approximately 1000 Å and 5000 Å.

Insulator 30 is preferably a high quality oxide which will prevent charge from leaking out vertical side surfaces 17 of floating gate 16. High temperature oxides, such as a LPCVD furnace grown oxide, are high quality oxides. Alternatively, other insulator materials, such as a nitride, silicon oxide or a spin-on-glass (SOG) can also be used, if floating gate undergoes the optional thermal oxidation described above to seal side surfaces 17.

Figure 6:
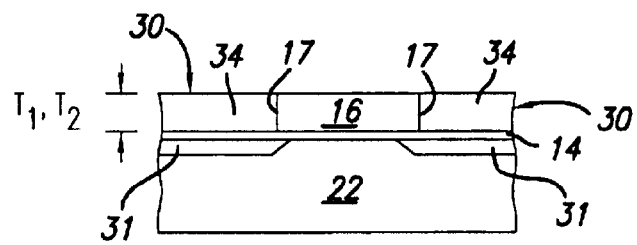

Next, insulator 30 is polished using convention chemical-mechanical polishing techniques. Insulator 30 is polished until thickness $T_2$ of second region 34 is substantially equal to thickness $T_1$ of floating gate 16. Thus, first region 32 of insulator 30 is completely removed from substrate 22. FIG. 6 illustrates the device following this polishing step. The result is a level, planar layer of floating gate 16 and insulator 30 on tunnel oxide 14.

Figure 7:
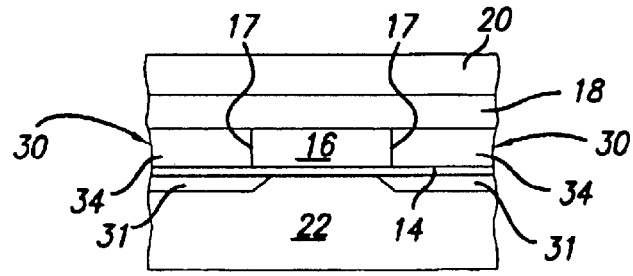

In the next step, dielectric layer 18 is deposited on the floating gate and insulator layer. Dielectric layer 18 can include any dielectric material. In the preferred embodiment of the invention, dielectric layer is an ONO layer with an electrical thickness of approximately 80 Å to 300 Å. Control gate layer 20 is then deposited on top of dielectric layer 18. Control gate layer 20 preferably comprises the same material as floating gate 16 and has a thickness substantially equivalent to that of floating gate 16. FIG. 7 illustrates the device with dielectric layer 18 and control layer 20.

If control gate layer 20 includes doped polysilicon or amorphous silicon, an optional layer 24 (FIG. 2) can be disposed on control gate layer 20 in order to lower the resistance of control gate 20. Layer 24 can include a salicide, such as titanium salicide or cobalt salicide, or a silicide, such as tungsten silicide.

Once control gate layer 20 has been deposited, another photomask (not shown) is placed on control gate layer 20, or on layer 24, and control gate layer 20 and dielectric layer 18 are etched to provide a stacked gate structure, as illustrated in FIG. 1. Subsequent source and drain implants 26 and 28, respectively, form the finished transistor. Insulator 30 may be removed during stacked gate etch as illustrated in FIG. 1. Alternatively, insulator 30 may remain or be partially removed.

While the present invention has been described with reference to a specific embodiment, the description is illustrative of the invention and is not to be construed as limiting the invention. Various modifications may occur to those skilled in the art without departing from the true spirit and scope of the invention as defined by the appended claims.

What is claimed is:

1. A method of making a flash memory cell including a substrate and a tunnel oxide layer formed on the substrate and a floating gate, the method comprising:

depositing an insulator layer comprising a high temperature oxide directly on exposed portions of the tunnel oxide layer and the floating gate, the insulator layer being deposited to a thickness greater than a thickness of the floating gate, wherein the insulator layer is in contact with vertical surfaces of the floating gate to prevent charge leaking from the floating gate, and wherein the insulator layer is formed by a LPCVD process;

polishing the insulator layer immediately after the step of depositing the insulator layer to reduce the thickness of the insulator layer and to provide a planar surface that exposes a top surface of the floating gate and the insulator layer; and depositing an ONO layer on the planar surface directly over the exposed top surface of the floating gate and the insulator layer.

2. The method of claim 1, wherein polishing the insulator layer includes using chemical mechanical polishing.

3. The method of claim 1, further comprising:

depositing a control gate layer on the ONO layer; and etching the control gate layer and the ONO layer to form a stacked gate structure of the flash memory cell.

4. A method of making a flash memory cell having a substrate and a tunnel oxide layer formed on the substrate, the method comprising:

depositing a floating gate layer on the tunnel oxide layer to a first thickness;

etching the floating gate layer, to provide a floating gate;

depositing an insulator layer comprising a high temperature oxide directly on exposed portions of the tunnel oxide layer and the floating gate, wherein the insulator layer has a second thickness that is greater than the first thickness, wherein the insulator layer is in contact with vertical surfaces of the floating gate, and wherein the insulator layer is formed by a LPCVD process;

polishing the insulator layer immediately after the step of depositing the insulator layer to provide a planar surface that exposes a top surface of the floating gate and the insulator layer; and depositing an ONO layer on the planar surface directly over the exposed top surface of the floating gate and the insulator layer.

5. The method of claim 4, wherein the first thickness of the floating gate layer is between approximately 500 Å and 2000 Å, and the second thickness of the insulator layer, is between approximately 1000 Å and 5000 Å.

6. The method of claim 4, wherein polishing the insulator layer includes using chemical mechanical polishing.

7. The method of claim 4, further comprising:

depositing a control gate layer on the ONO layer; and etching the control gate layer and the ONO layer to form a stacked gate structure of the flash memory cell.

8. The method of claim 4, wherein the floating gate layer comprises doped polysilicon.

9. The method of claim 4, wherein the floating gate layer comprises doped amorphous silicon.

10. A method of making a flash memory cell including a substrate, a tunnel oxide layer formed on the substrate and a floating gate, the method comprising:

depositing an insulator layer comprising a high quality oxide directly on the tunnel oxide layer and the floating gate, wherein the insulator layer is deposited to a thickness greater than a thickness of the floating gate, wherein the insulator layer is formed on and in contact with vertical surfaces of the floating gate to prevent charge leaking from the floating gate, and wherein the high quality oxide is formed by a LPCVD process;

polishing the insulator layer immediately after the step of depositing the insulator layer to reduce the thickness of the insulator layer and to provide a planar surface that exposes a top surface of the floating gate and the insulator layer; and depositing an ONO layer on the planar surface over the exposed top surface of the floating gate and the insulator layer.

\* \* \* \* \*